(12) United States Patent
Goida et al.

(10) Patent No.: US 8,447,057 B2
(45) Date of Patent: May 21, 2013

(54) PACKAGES AND METHODS FOR PACKAGING MEMS MICROPHONE DEVICES

(75) Inventors: Thomas Goida, Windham, NH (US); Jicheng Yang, North Andover, MA (US); Woodrow Beckford, Salisbury, NH (US)

(73) Assignee: Analog Devices, Inc., Norwood, MA (US)

(*) Notice: Subject to any disclaimer, the term of this patent is extended or adjusted under 35 U.S.C. 154(b) by 130 days.

(21) Appl. No.: 13/051,253

(22) Filed: Mar. 18, 2011

(65) Prior Publication Data

US 2012/0237073 A1    Sep. 20, 2012

(51) Int. Cl.
 *H04R 9/08* (2006.01)
 *H04R 11/04* (2006.01)
 *H04R 17/02* (2006.01)

(52) U.S. Cl.
 USPC .......................................... 381/361; 381/175

(58) Field of Classification Search
 USPC ................. 381/170, 174, 175, 191, 113, 116, 381/173, 361, 369; 257/414–420, 678, 685, 257/686; 438/50–53
 See application file for complete search history.

(56) References Cited

U.S. PATENT DOCUMENTS

| | | | |
|---|---|---|---|
| 5,870,482 | A | 2/1999 | Loeppert et al. |
| 8,199,939 | B2 | 6/2012 | Suvanto et al. |
| 2007/0071268 | A1 | 3/2007 | Harney et al. |
| 2007/0202627 | A1 | 8/2007 | Minervini |
| 2007/0278601 | A1 | 12/2007 | Goodelle et al. |
| 2008/0175425 | A1 | 7/2008 | Roberts et al. |
| 2008/0217766 | A1 | 9/2008 | Minervini |
| 2008/0304681 | A1 | 12/2008 | Langlois et al. |
| 2009/0202089 | A1 | 8/2009 | Zhang et al. |
| 2010/0086146 | A1 | 4/2010 | Gong et al. |
| 2010/0142744 | A1 | 6/2010 | Rombach et al. |
| 2010/0284553 | A1* | 11/2010 | Conti et al. ................... 381/174 |
| 2011/0108933 | A1* | 5/2011 | Nakatani ....................... 257/415 |
| 2011/0198714 | A1* | 8/2011 | Yang ............................. 257/416 |

FOREIGN PATENT DOCUMENTS

WO WO 2007/129787    11/2007
WO WO 2011/103720 A1    9/2011

* cited by examiner

*Primary Examiner* — Tuan D Nguyen
(74) *Attorney, Agent, or Firm* — Knobbe Martens Olson & Bear LLP

(57) ABSTRACT

Microelectromechanical systems (MEMS) microphone devices and methods for packaging the same include a package substrate having an acoustic pathway therethrough that opens to an interior of the device. A MEMS microphone die having an integrated filter and a movable membrane is positioned within the interior of the device. The package substrate includes a conductive layer facing the interior of the device, and a package filter formed from the conductive layer is provided along the acoustic pathway, resulting in increased packaged MEMS microphone device yield.

25 Claims, 7 Drawing Sheets

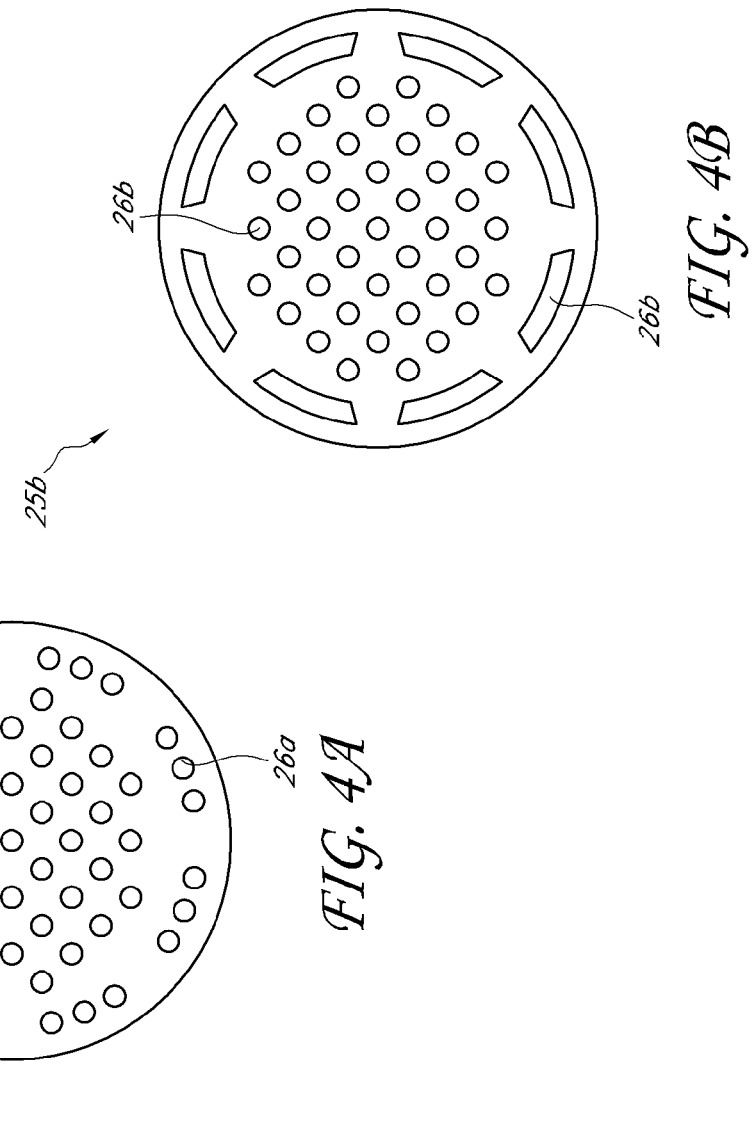

PACKAGES AND METHODS FOR PACKAGING MEMS MICROPHONE DEVICES

BACKGROUND

1. Field

Embodiments of the invention relate to microelectromechanical systems (MEMS) microphone devices and methods for packaging the same.

2. Description of the Related Technology

MEMS microphone die are often secured within a package for environmental protection and to aid in connecting the die to a larger circuit. The package can include a package lid mounted to a package substrate, and an aperture can be formed through some portion of the package to allow audio signals to reach the microphone.

Increasing packaged MEMS microphone device yield is an important commercial goal. Accordingly, there is a need to improve MEMS microphone device yield.

SUMMARY

In one embodiment, a packaged integrated microphone device is provided. The packaged integrated microphone device includes a package substrate having an acoustic pathway therethrough, an integrated microelectromechanical systems (MEMS) microphone die, and a package filter. The acoustic pathway opens to an interior of the device, and the package substrate includes a conductive layer facing the interior of the device. The integrated MEMS microphone die is positioned within the interior of the device and has a die cavity, a movable membrane, and an integrated filter. The die cavity and the integrated filter allow sound wave passage from the acoustic pathway to the movable membrane, and the integrated filter is positioned between the acoustic pathway and the movable membrane. The package filter is formed from the conductive layer of the package substrate, and is positioned along the acoustic pathway through the package substrate. The package filter is adapted to prevent particles from reaching the integrated filter.

In another embodiment, process of making a packaged integrated microphone device is provided. The process includes providing an integrated microelectromechanical systems (MEMS) microphone die, the integrated MEMS microphone die including a die cavity, a movable membrane, and an integrated filter between the die cavity and the movable membrane. The process further includes forming an acoustic pathway through a package substrate between an exterior of the device and an interior of the device, the package substrate including a conductive layer facing the interior of the device. The process further includes providing a package filter along the acoustic pathway, the package filter formed from the conductive layer. The process further includes mounting the integrated MEMS microphone die in the interior of the device in a position to allow sound wave passage through the acoustic pathway, package filter, die cavity and integrated filter to the movable membrane.

In another embodiment, a packaged microelectromechanical systems (MEMS) microphone is provided. The packaged MEMS microphone includes a package housing having a sound channel therethrough, a MEMS microphone die having a flexible diaphragm and a die filter, and a particle filter positioned to prevent particles from entering the sound channel from outside the package housing. The sound channel communicates sound from outside the package housing to an interior of the housing, and the package housing includes a conductive layer facing the interior of the housing. The conductive layer is patterned to define conductive traces. The MEMS microphone die is positioned within the housing interior and the die filter is positioned between the sound channel and the flexible diaphragm. The particle filter formed from the conductive layer of the package housing.

BRIEF DESCRIPTION OF THE DRAWINGS

FIG. 4A is a plan view of a front face of a first embodiment of the integrated filter of the MEMS microphone die of FIG. 3.

FIG. 4B is a plan view of a front face of a second embodiment of the integrated filter of the MEMS microphone die of FIG. 3.

DETAILED DESCRIPTION OF EMBODIMENTS

Figure 1A:
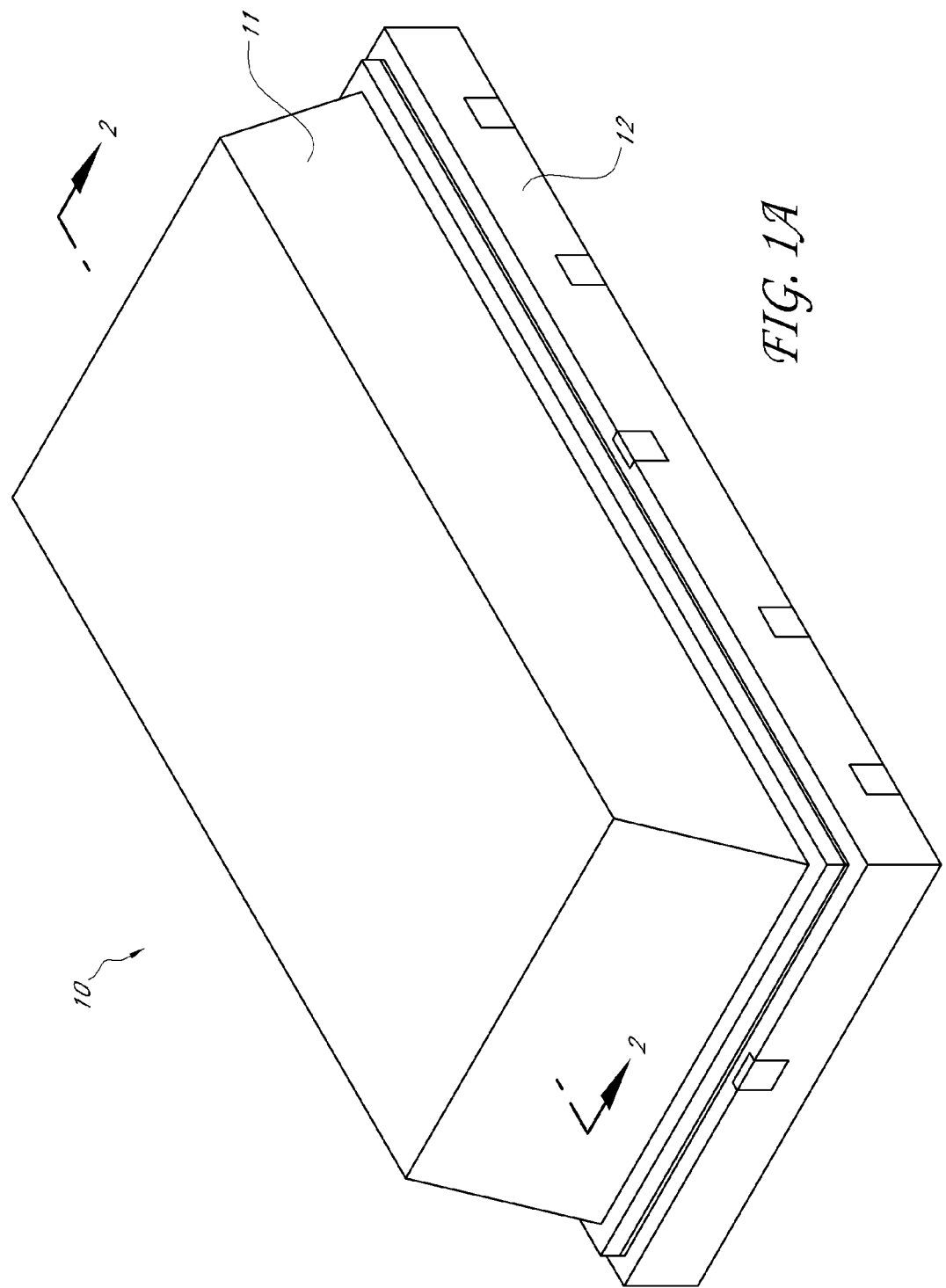
FIG. 1A is a top perspective view of a packaged MEMS microphone device according to one embodiment.

Packaged MEMS microphone devices and methods of packaging the same will be described while referring to the accompanying drawings. Like parts and components are designated by the same reference numerals for the reader's ease. The drawing are schematic and not to scale.

MEMS microphone devices must be able to communicate sound waves to the sound-sensitive membrane. That need is in tension with the desire to seal such electronic devices in the course of packaging. Inclusion of an integrated filter within the microphone die can prevent particles from reaching the microphone's sensitive MEMS membrane. However, it has been found that, despite the addition of the integrated filter, some fraction of the microphone die nevertheless became contaminated sufficiently to reduce yield during packaging. Without being limited by theory, it is believed that, although the integrated filter blocks many particles during packaging, these particles can became vaporized during subsequent packaging steps utilizing high heat, such as soldering. The vapor from these particles can reach the membrane on the microphone die, condense and render the microphone inoperable.

The addition of an upstream filter, as included in embodiments described herein, may also suffer from vaporization during soldering. However, if the upstream filter is placed at a suitable distance upstream of the microphone die and its integrated filter, the vapor will condense along the pathway and insufficient contaminant vapor would reach the membrane to hinder operation. For example, the upstream filter can be formed from a conductive layer on an interior surface of a package substrate. By forming the upstream filter in this manner, the filter can be formed while patterning traces on the conductive layer, thereby providing a robust and integrated solution to vapor contamination without entailing a separate mask. Additionally, providing the upstream filter on the interior surface of the package substrate can balance the distance between the upstream filter and sources of solder flux with the distance between the two filters, thereby balancing a desire to prevent particles from reaching the movable MEMS membrane with avoiding blockage of the acoustic pathway.

Figure 1B:
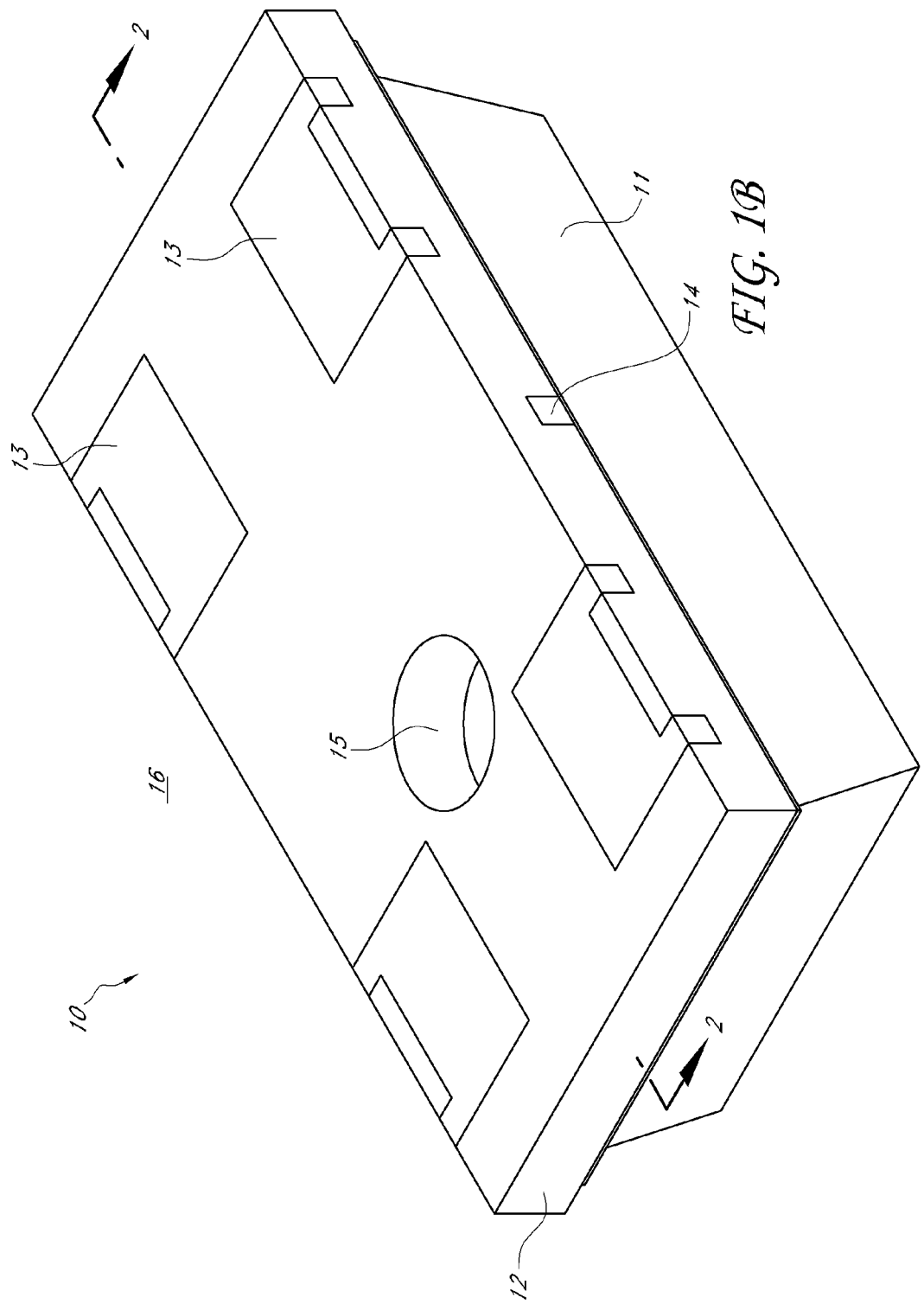
FIG. 1B is a bottom perspective view of the packaged MEMS microphone device of FIG. 1A.

FIGS. 1A and 1B show a packaged MEMS microphone device or package 10 according to one embodiment. The package 10 comprises a package lid 11 and a package substrate 12, collectively referred to as the package housing. The package lid 11 is secured to the package substrate 12 to form an interior of the housing, which contains a MEMS microphone die, an example of which will be described below with reference to FIGS. 2-4B. The package lid 11 may be formed using one or more materials, including a metal and/or a polymer, such as a plastic. In some embodiments, the package lid may comprise multiple layers, one or more of which may be a conductive layer capable of transmitting electrical signals and/or providing electromagnetic shielding.

With reference to FIG. 1B, the package substrate 12 includes one or more contacts 13 for electrically connecting the package to a printed circuit board or other larger electrical apparatus or system, and a ground lead 14, which in some embodiments may be used as a reference voltage for the contacts 13 and/or to ground the package lid 11. Persons of ordinary skill in the art will recognize that the package substrate 12 could include any suitable number or combination of contacts and power leads. Additionally, FIG. 1B includes a sound channel or acoustic pathway 15 on the bottom of the package 10, which forms a passage through the package substrate 12, thereby allowing ingress of audio signals from a package exterior 16 to the package interior. In the illustrated embodiment, the package substrate 12 can include ceramic package material or a printed circuit board (PCB) material (e.g., using layers of FR-4 board and metal such as copper). The package substrate 12 can have any suitable thickness. Although preferred package substrate materials have been disclosed, persons of ordinary skill in the art will recognize that there are many other suitable materials and thicknesses for the package substrate 12.

Figure 2:
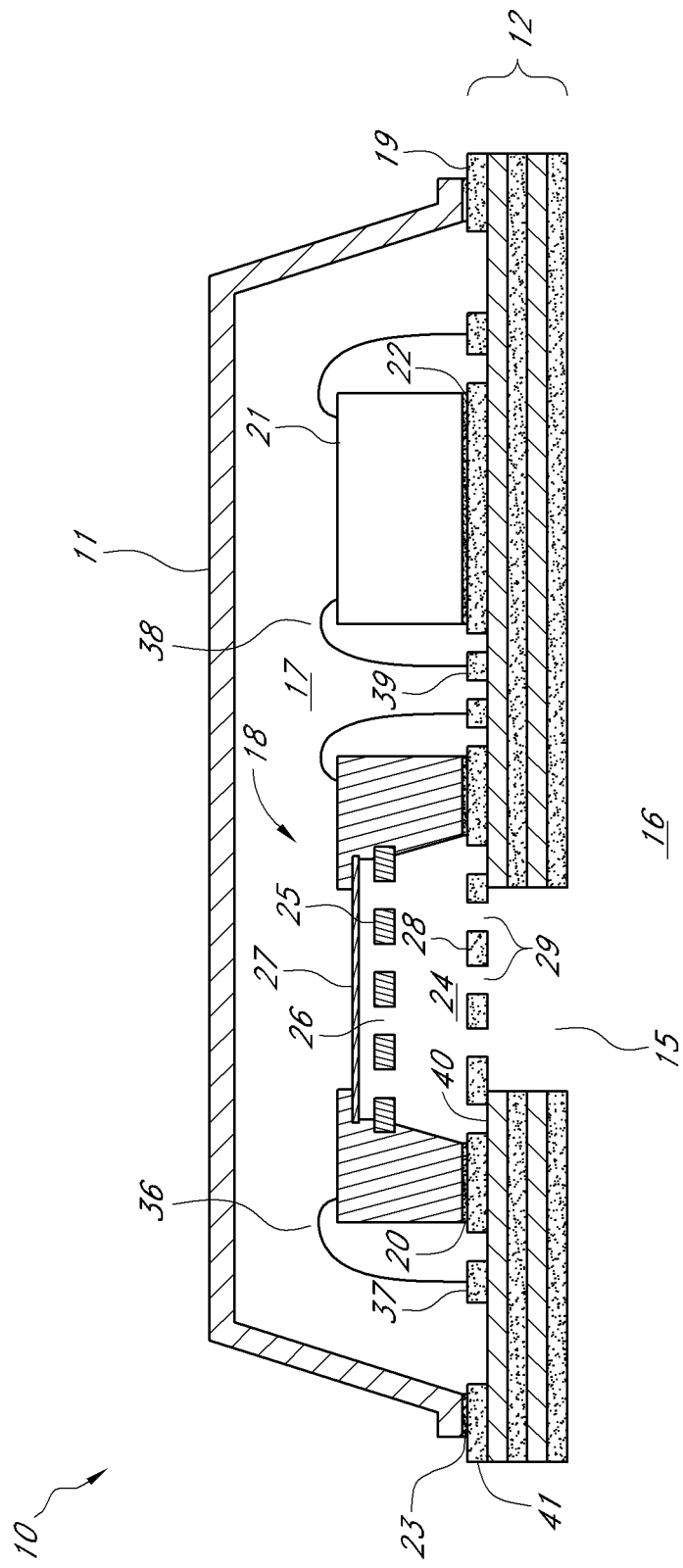
FIG. 2 is a cross-sectional view of the packaged MEMS microphone device taken along lines 2-2 of FIG. 1A.

FIG. 2 illustrates a cross-sectional view of the packaged MEMS microphone device of FIG. 1A, taken along lines 2-2. The packaged MEMS microphone device includes the lid 11, a lid adhesive 23, the package substrate 12, the acoustic pathway 15, an integrated MEMS microphone die 18, a microphone die adhesive 20, microphone die leads 36, an integrated circuit die 21, an integrated circuit die adhesive 22, integrated circuit die leads 38, and a particle or package filter 28. The package lid 11 is mounted and preferably sealed to a top face 19 of the package substrate 12, defining a package interior 17 therebetween.

The illustrated package substrate 12 is a multi-layer substrate including a conductive layer 41 at the top surface 19 of the package substrate 12 facing the package interior 17. The conductive layer 41 has been patterned to form traces, such as the traces 37, 39. The conductive layer 41 has also been used to form the particle filter 28, as will be described in further detail below. The package substrate 12 can be any suitable multi-layer substrate, such as a printed circuit board (PCB) including alternating conductive and nonconductive layers. In one implementation, the conductive layers comprise copper and the nonconductive layers comprise a prepreg material, such as FR-4 board. Although the illustrated package substrate 12 includes five layers, the package substrate 12 can include more or fewer layers. For example, a three layer configuration of the package substrate 12 is illustrated and described below with reference to FIGS. 5A-5B.

The illustrated integrated MEMS microphone die 18 is mounted to the top face 19 of the package substrate 12 using the microphone die adhesive 20. The microphone die adhesive 20 can be, for example, a conductive or nonconductive epoxy. Also illustrated in FIG. 2 is the integrated circuit die 21, which is mounted to the top face 19 of the package substrate 12 using the integrated circuit die adhesive 22, which can be implemented by using the same or a different material as the microphone die adhesive 20. The integrated circuit die 21 can be used to process data from the MEMS microphone die 18, and in certain implementations, is an application specific integrated circuit (ASIC). The illustrated embodiment also includes a lid adhesive 23 for bonding the lid 11 to the top surface 19 of the substrate 12. The lid adhesive 23 may comprise any number of materials, including a conductive or nonconductive epoxy.

The illustrated microphone die leads 36 are connected to substrate traces 37 formed from the conductive layer 41 so that the MEMS microphone die 18 can communicate electrical signals that can be further processed and used by external circuitry (e.g. a mobile phone device). Similarly, the illustrated integrated circuit die 21 can communicate with other devices using integrated circuit die leads 38 connected to other substrate traces 39 formed from the conductive layer 41. Although the illustrated microphone and integrated circuit die 18, 21 are shown as having leads and chip adhesives, in certain implementations, the microphone and integrated circuit die 18, 21 can be connected in other ways. For example, solder bumps or balls could be deposited onto chip pads on the top side of the integrated circuit die 21, and after flipping the die upside down and aligning the chip pads to matching pads on the package substrate 12, the solder could be flowed so at to interconnect the die and the substrate. Other methods of interconnecting chips to package substrates include the use of anisotropic conductive filler (ACF), as will be appreciated by the skilled artisan.

With continuing reference to FIG. 2, the acoustic pathway 15 forms a passage through the package substrate 12, thereby allowing ingress of audio signals from the package exterior 16 to the package interior 17. Once the audio signals enter the package interior 17, a die cavity 24 permits sound to reach an integrated die filter 25 having integrated filter apertures 26, which permit the audio signals to reach a flexible diaphragm or movable membrane 27. One example of the MEMS microphone die 18 is discussed in further detail below with reference to FIGS. 3-4B. In the illustrated embodiment, a ledge 40 results from the width of the acoustic pathway 15 being less that the width of the die cavity 24, which can have advantages for improving yield. However, in certain implementations the acoustic pathway 15 can have a width that is equal to or greater than a width of the die cavity 24.

The acoustic pathway 15 can be formed by a variety of methods, such as by drilling, etching or the use of a laser. The width of the acoustic pathway 15 could be a variety of widths depending on many factors, including the size of the microphone die being used. Typically for a MEMS microphone application, the width of the acoustic pathway 15 is in the range of about 0.1-1.0 mm, or more particularly about 0.2-0.5 mm. Although the acoustic pathway 15 is illustrated as a circular channel that is substantially straight, the acoustic pathway 15 could comprise a variety of shapes and could bend or wind through the package substrate 12.

In addition to the integrated filter 25 within the die, the acoustic pathway 15 includes a particle filter 28 formed from the top conductive layer 41 of the package substrate 12. The particle filter 28 includes package filter apertures 29 to aid in transmitting sound through the acoustic pathway 15 without permitting certain particles therethrough. Additional details of the particle filter 28 are described below with reference to FIGS. 5A-5B.

Figure 3:
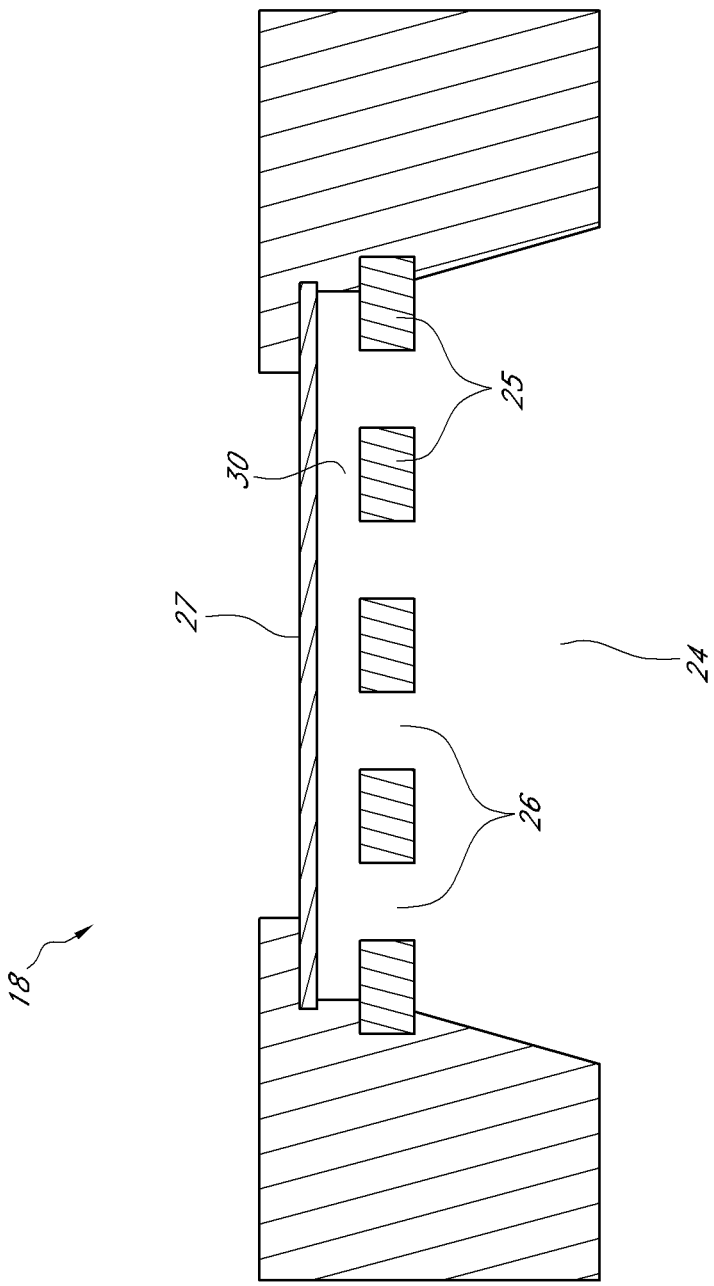
FIG. 3 is a schematic illustration of a cross-sectional view of an example of a MEMS microphone die that can be used in the packages disclosed herein.

FIG. 3 is a schematic illustration of a cross-sectional view of one example of the MEMS microphone die 18 that can be used in the packages disclosed herein. Such MEMS microphone die are described, for example, in U.S patent publication no. US 2007/0071268 A1, published Mar. 29, 2007, entitled "PACKAGED MICROPHONE WITH ELECTRICALLY COUPLED LID," and U.S. patent publication no. US 2009/0202089 A1, published Aug. 13, 2009, entitled "MICROPHONE WITH REDUCED PARASITIC CAPACITANCE."

With continuing reference to FIG. 3, the illustrated MEMS microphone die 18 defines the die cavity 24, a gap 30, the movable membrane 27, and the integrated filter 25 having the integrated filter apertures 26. During operation of the microphone, audio signals enter the die cavity 24, pass through the integrated filter apertures 26, and reach the movable membrane 27. The integrated filter 25 is fixed and electrically connected (e.g., grounded), and serves in conjunction with the movable membrane 27 to form electrodes of a variable capacitor that is used to detect audio signals. For example, audio signals can cause the movable membrane 27 to vibrate relative to the fixed integrated filter 25, thus producing a changing capacitance. On-chip circuitry, or off-chip circuitry such as the circuitry of the integrated circuit die 21 illustrated in FIG. 2, can be used to convert this changing capacitance into electrical signals that can be further processed and used by external circuitry (e.g. a mobile phone device).

With continuing reference to FIG. 3, the integrated filter 25 of the MEMS microphone die 18 serves an additional purpose. On one hand, the integrated filter 25 is fixed, and serves in conjunction with the movable membrane 27 to form a variable capacitor that is used to detect audio signals, as described above. However, the integrated filter 25 also serves to improve microphone die yield by preventing particles from reaching the movable membrane 27 where they might cause the movable membrane 27 to stick and render the microphone inoperable.

The MEMS microphone die 18 is preferably formed using a silicon or silicon-on-insulator (SOI) wafer, with a die thickness typical of integrated MEMS devices, e.g., 300-400 µm. In one embodiment, the gap 30 is selected to be 3-5 µm. The integrated filter 25 has a thickness suitable for integration within an integrated MEMS device, such as about 10-50 µm, more particularly about 20-30 µm. The width of the integrated filter 25 varies with processing technology, but a typical width is in the range of about 0.2-1.0 mm, more particularly about 0.5-0.8 mm. Although reference has been made to preferred dimensions for the components of the MEMS microphone die 18, persons of ordinary skill in the art will recognize that many other choices are appropriate.

FIG. 4A and FIG. 4B each illustrate a plan view of a front face of an embodiment of the integrated filter 25 of the MEMS microphone die 18 of FIG. 3. Although only two embodiments of the integrated filter 25 are illustrated, numerous other configurations and opening distributions are possible. In these embodiments the integrated filter is preferably made from the silicon of the wafer from which the die is fabricated, or from an integrated metal layer, although a variety of different materials could also be used.

With reference to FIG. 4A, the illustrated integrated filter 25a includes the integrated filter apertures 26a, which are distributed across the front face of the integrated filter 25a. The width or diameter of the integrated filter apertures 26a, representing the smallest lateral dimension thereof, is chosen to prevent particles large enough to interfere with operation of the MEMS microphone from passing, for example about 1-25 µm, more preferably about 4-8 µm.

The illustrated integrated filter 25b of FIG. 4B includes the integrated filter apertures 26b. This embodiment illustrates that the integrated filter apertures 26b need not be circular, and that the integrated filter apertures 26b may comprise a variety of shapes. Although the embodiments of the integrated filters 25a, 25b illustrated in FIGS. 4A and 4B are circular, any filter shape is possible, such as a rectangle, oval, or polygon, as long as the filter permits sound waves or vibrations therefrom to pass while filtering out particles of a size likely to interfere with MEMS membrane operability.

With reference now back to FIGS. 2-3, in addition to the integrated filter 25 of the MEMS microphone die 18, the illustrated packaged MEMS microphone device 10 includes the package filter 28. The presence of this second filter has been found to significantly improve packaged MEMS microphone device yield, despite the fact that the package filter apertures 29 of the illustrated embodiment are larger than the integrated filter apertures 26. Without being limited by theory, it is believed that in packaged MEMS microphone devices lacking the package filter 28, particles blocked by the integrated filter 25 before or during packaging settle on the integrated filter and can vaporize during subsequent packaging steps utilizing high heat, such as soldering. Thus, despite the fact that the integrated filter 25 does stop harmful particles, it may not stop the passage of vapors released during heat-intensive steps, which can reach the movable diaphragm and render the die inoperable.

Surprisingly, when the package filter 28 is included in the packaged MEMS microphone device 10, and placed at a suitable distance upstream from the integrated filter 25, many of the larger particles released before and during packaging settle on the package filter 28 instead of the integrated filter 25. During subsequent heat-intensive packaging steps such as soldering, the particles which have settled on the package filter 28 vaporize. However, the distance between the two filters is such that the released vapor condenses or coats on the acoustic pathway, the surfaces of the die cavity 24, and/or the integrated filter 25, so that little or no vapor reaches and condenses on the movable membrane 27. The yield can be similarly sensitive to the distance between the solder and the package filter 28.

Additionally, in embodiments where the width of the acoustic pathway 15 is less than the width of the die cavity 24, the ledge 40 provides an additional surface on which the particles vaporized from the package filter 28 may condense. Accordingly, even when the package filter apertures 29 are larger than the integrated filter apertures 26 as described for the illustrated embodiment, the addition of the package filter 28 sufficiently upstream significantly increases yield relative to a packaged microphone device using only the integrated filter, yet not so far as cause an increase in the size of the package. In one embodiment, the package filter 28 is spaced upstream from the integrated filter 25 by a distance of about 5 µm to 1 mm, more preferably about 300 µm to 800 µm upstream of the integrated filter 25.

Figure 5A:
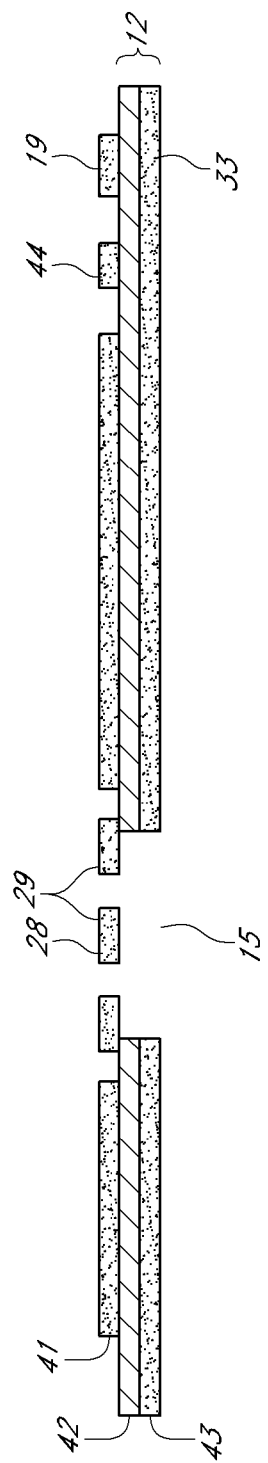
FIG. 5A is a cross-sectional view of one embodiment of a package substrate that includes a package filter formed from a top conductive layer of the package substrate.

FIG. 5A illustrates a cross-sectional view of one embodiment of the package substrate 12 that includes a package filter 28 formed from the top conductive layer 41 of the package substrate 12. The package substrate 12 is formed from an electrical interconnect apparatus, such as a PCB material having layers which include the first or top conductive layer 41, an insulative or nonconductive layer 42, and a second or bottom conductive layer 43. Although many materials would be suitable for the conductive layers 41, 43 and the insulative layer 42, in a preferred embodiment the conductive layers 41, 43 are metal, particularly copper, and the insulative layer 42 is a prepreg material, such as FR-4 board. Although a three layer implementation is illustrated, the package substrate 12 could comprise any number of such layers, with different or the same conductive and insulative materials on each layer. In a preferred embodiment, the package substrate 12 comprises alternating conductive and insulative layers, wherein the layers defining the top face 19 and a bottom face 33 of the package substrate 12 are each a conductive layer. The thickness of the package substrate 12 can be as described above with respect to FIG. 1B.

With continuing reference to FIG. 5A, the first conductive layer 41 disposed on the top surface 19 of the package substrate 12 includes the package filter 28. The package filter 28 could be a variety of thicknesses suitable for integration with the package substrate 12, and also for carrying signals, as the same layer 41 provides traces on the package substrate 12. Suitable thicknesses include thicknesses between about 5 µm to about 30 µm, more preferably about 15 µm to about 25 µm. Although reference has been made to preferred dimensions for the package filter 28, persons of ordinary skill in the art will recognize that many other choices are appropriate. The package filter 28 includes the package filter apertures 29, which can be manufactured by using a variety of techniques. For example, the package apertures 29 could be made using a traditional hole formation technique, such as photolithography and etch, stamping, drilling or laser ablation.

In the embodiments described above, the top conductive layer 41 of the package substrate 12 includes the package filter 28. By forming the package filter 28 in the top conductive layer 41 of the package substrate 12, the package filter can be formed while patterning traces 44 on the top conductive layer 41, thereby reducing manufacturing costs of the package filter and enhancing design integration. Thus, the package filter 28 can be disposed adjacent the traces 44, and can be formed from the same material as at least one trace of the conductive layer 41. Additionally, by forming the package filter 28 from the top conductive layer 41 of the package substrate 12 facing the interior of packaged device can provide distance between the package filter and sources of solder flux that can clog apertures of the filter and cause acoustic pathway blockage. For example, the bottom conductive layer 43 can include leads that can be soldered and serve as sources of contaminant vapors. Forming the package filter 28 from the top conductive layer 41 can reduce particular buildup on the package filter 28 relative to a design in which the package filter 28 is formed at a different location.

Figure 5B:
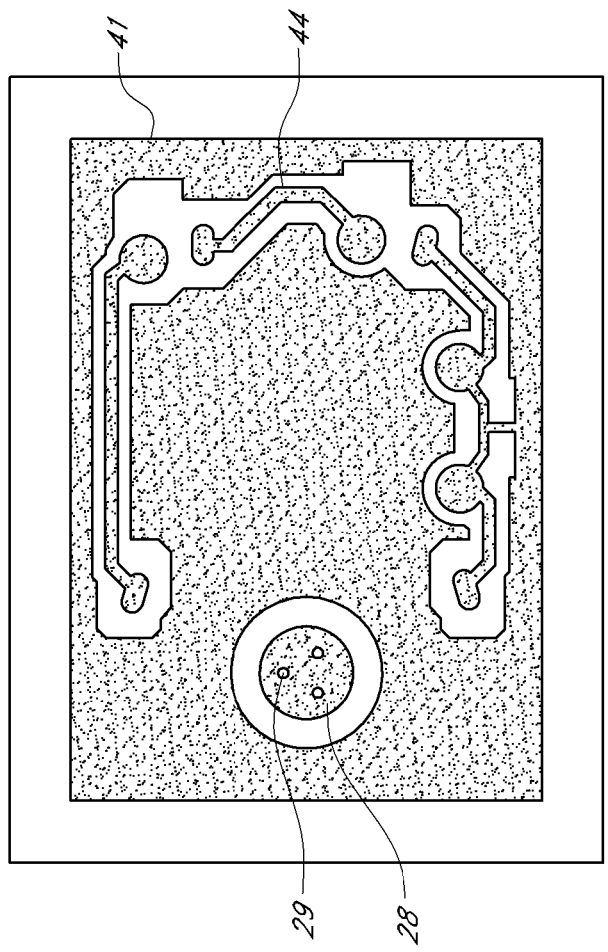
FIG. 5B is a plan view of one example of the top conductive layer of FIG. 5A.

FIG. 5B is a plan view of one example of the top conductive layer 41 of FIG. 5A. Although only one embodiment of the package filter 28 is illustrated, numerous other embodiments are possible. The illustrated package filter 28 includes the package filter apertures 29 distributed across the front face of the package filter 28. The width or diameter of the package filter apertures 29 could be a variety of sizes, but because of the protection afforded by the integrated filter 25, can vary within a larger range of sizes, for example 2-100 µm, or more preferably 2-80 µm. Alternatively, the diameter of the package filter apertures 29 could be determined with relation to the diameter of the integrated filter apertures 26, such as being in the range of about 0.5-10 times the diameter of the integrated filter apertures 26, more preferably about 2-5 times.

Although the illustrated embodiment of package filter 28 includes circular package filter apertures, the package filter apertures 29 need not be circular, and may comprise a variety of shapes patterned in any arrangement across the face of the package filter 28. In these embodiments, the shortest dimension of the packaged filter apertures 29 can have a value of 2-100 µm, more preferably 2-80 µm. Alternatively, the shortest dimension of the package filter apertures 29 could be determined with relation to the shortest dimension of the integrated filter apertures 26, such as being in the range of 0.5-10 times the shortest dimension of the integrated filter apertures 26, more preferably about 2-5 times. Additionally, although the embodiment of the package filter 28 illustrated in FIG. 5B is circular, any filter shape is possible, such as a rectangle, oval, or polygon. In a preferred embodiment, the filter is larger and positioned to completely cover the acoustic pathway 15.

The illustrated package filter 28 includes three apertures 29. However, any suitable number of apertures 29 can be included. In one implementation, the number of apertures 29 is selected to be in the range of 2 to about 1000 apertures.

The electrical potential of the package filter 28 can be controlled in any suitable way, such as by using the traces 44 to electrically connect the package filter 28 to a ground node, a power node, or a signal node. However, the package filter 28 need not be electrically connected to a node and can be electrically floating. In one embodiment, the package filter 28 is electrically connected to a bias circuit, which can be located, e.g., on the package substrate, on the MEMS microphone die 18 or integrated circuit die 21, external to the packaged MEMS microphone device, or in any other suitable location. The bias circuit can bias the package filter 28 so as to attract particles to the package filter 28 to reduce the number of particles that reach the MEMS microphone die during operation. For example, the particles can have a charge, and the bias circuit can be used to attract the particles to a surface of the package filter 28 using electrostatic forces.

Figure 6:
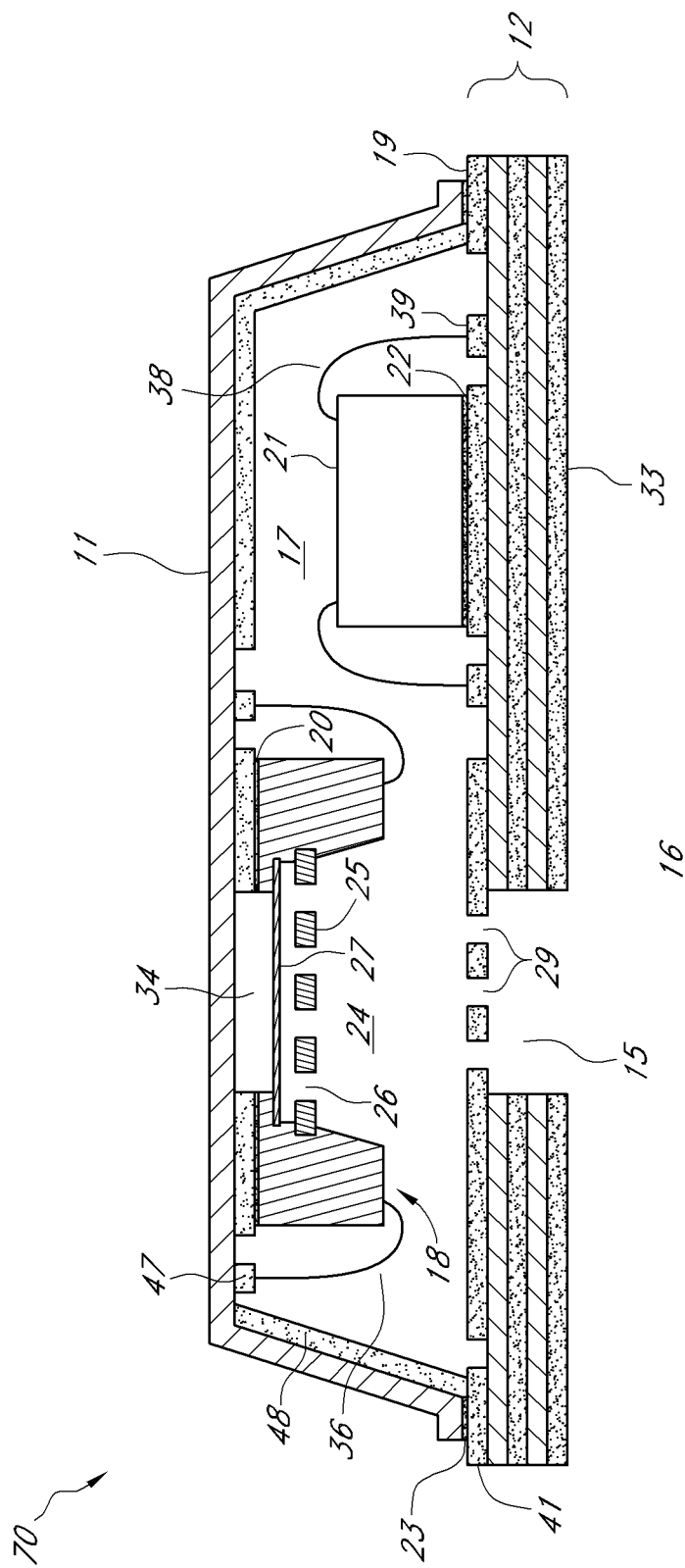
FIG. 6 is a cross-sectional view of a packaged MEMS microphone device in accordance with another embodiment.

FIG. 6 illustrates a cross-sectional view of a packaged MEMS microphone device 70 in accordance with another embodiment. The packaged MEMS microphone device 70 includes the lid 11, the lid adhesive 23, the package substrate 12, the acoustic pathway 15, the integrated MEMS microphone die 18, the microphone die adhesive 20, the microphone die leads 36, the integrated circuit die 21, the integrated circuit die adhesive 22, the integrated circuit die leads 38, and the particle filter 28. Certain details of the illustrated packaged MEMS microphone device 70 can be similar to the packaged MEMS microphone device 10 of FIGS. 1A-2. However, in contrast to the packaged MEMS microphone device of FIGS. 1A-2, the MEMS microphone die 18 of FIG. 6 is mounted on the package lid 11 opposite the acoustic pathway 15.

To aid in providing back volume for the MEMS microphone die 18, a recess 34 has been created in the package lid 11 so as to allow the movable membrane 27 to vibrate during operation. The recess 34 could be created by a variety of manufacturing techniques, such as drilling or etching. It will be understood that such a recess may not be needed if the membrane 27 is sufficiently spaced below an upper surface of the MEMS microphone die 18. In the illustrated embodiment, the MEMS microphone die 18 will typically communicate with other devices by means of the microphone die leads 36 connected to package lid tracings 47 on a lid conductive layer 48.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In addition, while several variations of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the claims that follow.

What is claimed is:

1. A packaged integrated microphone device, comprising:
   a package substrate having an acoustic pathway therethrough, wherein the acoustic pathway opens to an interior of the device, and wherein the package substrate includes a conductive layer facing the interior of the device;
   an integrated microelectromechanical systems (MEMS) microphone die positioned within the interior of the device and having a die cavity, a movable membrane, and an integrated filter, wherein the die cavity and the integrated filter allow sound wave passage from the acoustic pathway to the movable membrane, and the integrated filter is positioned between the acoustic pathway and the movable membrane; and
   a package filter formed from the conductive layer of the package substrate, the package filter positioned along the acoustic pathway through the package substrate, wherein the package filter is adapted to prevent particles from reaching the integrated filter.

2. The packaged integrated microphone device of claim 1, wherein the package substrate includes a printed circuit board.

3. The packaged integrated microphone device of claim 2, wherein the package substrate further includes an insulative layer adjacent the conductive layer.

4. The packaged integrated microphone device of claim 3, wherein the package filter is disposed adjacent and formed from the same material as at least one trace of the conductive layer.

5. The packaged integrated microphone device of claim 1, wherein the package filter includes a plurality of package filter apertures.

6. The packaged integrated microphone device of claim 5, wherein the integrated filter comprises a plurality of integrated filter apertures, and wherein a width of each of the package filter apertures is in the range of about 0.5 times to about 10 times a shortest dimension of each of the integrated filter apertures.

7. The packaged integrated microphone device of claim 6, wherein a width of each of the package filter apertures is in the range of about 2 μm to about 80 μm.

8. The packaged integrated microphone device of claim 6, wherein a width of each of the package filter apertures is in the range of about 2 times to about 5 times the shortest dimension of each of the integrated filter apertures.

9. The packaged integrated microphone device of claim 5, wherein the package filter apertures are substantially circular.

10. The packaged integrated microphone device of claim 1, further comprising a package lid mounted to an interior surface of the package substrate to define the interior of the device.

11. The packaged integrated microphone device of claim 1, wherein the MEMS microphone die is mounted on the package substrate.

12. The packaged integrated microphone device of claim 11, wherein a width of the die cavity is greater than a width of the acoustic pathway, and wherein the MEMS microphone die is mounted on the package substrate over the acoustic pathway to define a ledge.

13. The packaged integrated microphone device of claim 11, further comprising an integrated circuit mounted on the package substrate adjacent the MEMS microphone die.

14. The packaged integrated microphone device of claim 1, wherein the integrated filter comprises a plurality of integrated filter apertures, the integrated filter apertures having a width or diameter in a range of about 4 μm to about 8 μm.

15. The packaged integrated microphone device of claim 1, wherein the package filter is electrically connected to a bias circuit configured to bias the package filter so as to attract particles to the package filter.

16. A packaged microelectromechanical systems (MEMS) microphone, comprising:
    a package housing having a sound channel therethrough, wherein the sound channel communicates sound from outside the package housing to an interior of the housing, and wherein the package housing includes a conductive layer facing the interior of the housing, the conductive layer patterned to define conductive traces;
    a MEMS microphone die having a flexible diaphragm and a die filter, wherein the MEMS microphone die is positioned within the housing interior and the die filter is positioned between the sound channel and the flexible diaphragm; and
    a particle filter positioned to prevent particles from entering the sound channel from outside the package housing, the particle filter formed from the conductive layer of the package housing.

17. The packaged MEMS microphone of claim 16, wherein the particle filter is spaced upstream from the die filter by a distance ranging between about 5 μm to about 1 mm.

18. The packaged MEMS microphone of claim 16, wherein the particle filter is spaced downstream from the die filter by a distance ranging between about 300 μm to about 800 μm.

19. The packaged MEMS microphone of claim 16, wherein the package housing comprises a package lid and a package substrate.

20. The packaged MEMS microphone of claim 19, wherein the package substrate is a printed circuit board (PCB).

21. The packaged MEMS microphone of claim 19, wherein the package lid is mounted on the package substrate to define the housing interior, and wherein the MEMS microphone die is mounted on the package substrate.

22. The packaged MEMS microphone of claim 19, wherein the package lid is mounted on the package substrate, and wherein the MEMS microphone die is mounted on the package lid.

23. The packaged MEMS microphone of claim 22, wherein the package lid comprises a recess, and wherein the MEMS microphone die is mounted adjacent the recess.

24. The packaged MEMS microphone of claim 22, wherein the package lid comprises conductive package lid tracings, and wherein the MEMS microphone die is electrically coupled to at least one package lid tracing using microphone die leads.

25. The packaged MEMS microphone of claim 22, wherein the particle filter is formed from the package substrate.

* * * * *